United States Patent [19]
Boer et al.

[11] 4,252,573
[45] Feb. 24, 1981

[54] COLLECTOR GRID FOR CDS/CUS PHOTOVOLTAIC CELLS

[75] Inventors: Karl W. Boer, Kennett Square, Pa.; Norman S. Freedman, Murray Hill, N.J.; Henry C. Hadley, Jr.; James Phillips, both of Newark, Del.; Manuel Ruiz-Urbieta, Brussels, Belgium

[73] Assignee: University of Delaware, Newark, Del.

[21] Appl. No.: 584,384

[22] Filed: Jun. 6, 1975

Related U.S. Application Data

[63] Continuation-in-part of Ser. No. 419,800, Nov. 28, 1973, abandoned.

[51] Int. Cl.² .............................................. H01L 31/06
[52] U.S. Cl. ...................................... 136/256; 136/260
[58] Field of Search ................ 136/89, 89 CC, 89 CD

[56] References Cited

U.S. PATENT DOCUMENTS

| | | |
|---|---|---|
| 2,820,841 | 1/1958 | Carlson et al. . |
| 3,442,007 | 5/1969 | Griffin et al. ...................... 136/89 X |
| 3,489,615 | 1/1970 | Mann et al. . |
| 3,589,946 | 6/1971 | Tarneja et al. ..................... 136/89 X |
| 3,811,954 | 5/1974 | Lindmayer ............................ 136/89 |

*Primary Examiner*—Aaron Weisstuch
*Attorney, Agent, or Firm*—Mortenson & Uebler

[57] ABSTRACT

By increasing the line spacing and the width of the grid wires of cadmium sulfide/copper sulfide photovoltaic cells, an easier to manufacture, low cost cell having a higher conversion efficiency is obtained. Seven to eight grid wires per inch have been found to be particularly desirable in achieving these end results.

1 Claim, 3 Drawing Figures

COLLECTOR GRID FOR CDS/CUS PHOTOVOLTAIC CELLS

The Government has rights in this invention pursuant to Grant No. AER72-03478A3, formerly GI34782.

This is a continuation-in-part of Ser. No. 419,800 filed on Nov. 28, 1973 by Karl W. Boer, et al, now abandoned.

BACKGROUND OF THE INVENTION

This invention relates to an improved collector grid for CdS/Cu$_x$S type photovoltaic cells.

It is known that poor design of the collector grid of a solar cell can cause significant increases in the total series resistance of the cell thus resulting in lower solar energy conversion efficiencies. Accordingly, various grid structures and designs have been tried over the years in an effort to improve the cell efficiency.

The transparent current collecting electrode, which is necesssary for the front wall type solar cells, has essentially two requirements. First, it must admit as much light to the active region of the cell as possible and second, the generated current must be collected and carried to a contact tab. In cadmium sulfide-copper sulfide type solar cells (or as more broadly designated, CdS/Cu$_x$S type cells, x may vary between one and two, preferably closer to two) the copper compound generally has a higher resistance than is true for other type solar cells. Accordingly, relatively close grid wire spacings have been used. Close spacing was also thought necessary to minimize losses due to the recombination of carriers in the Cu$_x$S layer.

Historically, metal mesh grids were applied to a CdS/Cu$_x$S cell by Griffin at Harshaw Company using a mesh of approximately seventy lines per inch and having an 85% light transmission efficiency. This work is described in a report entitled "Research on Solar Energy Conversion Employing Photovoltaic Properties of CdS" Harshaw Chemical Co., AF 33 (616)-7528 Final Report Dec. 1961. Before metal mesh grids were used large area cell efficiencies were generally limited by high series resistance. The cell output efficiency was considerably improved by Clevite Corporation who determined that by switching from a grid with a spacing of 60×60 lines per inch and a 1 mil line width, which provided an 85% light transmission to a grid of 60×10 lines per inch (1pi) with 1 mil line widths, a 91% theoretical light transmission was achieved. Later work was done to optimize the collector grid design. This work was described in a report "Development of Improved CdS Solar Cells", Clevite Corp., NAS 3-13467, Final Report 1970. In this work different grid spacings between 50 and 80 lines per inch were used maintaining light transmission constant. The conclusion was that there was a trend toward increasing series resistance that would be detrimental to increasing grid spacing any further.

The metal mesh rid collector is generally photo etched from a specially rolled sheet of thin copper. Unfortunately, such copper is not only difficult to handle but also extremely costly because of its extreme thinness. Also, because it is such a delicate thinness, it is difficult to make grids and costs, in large scale manufacture, remain prohibitively high and preclude large scale utilization of solar cells for low cost terrestial use.

In most cells of the prior art, in order to achieve an optimized grid collector, the grid wires must be spaced closely enough to efficiently collect the generated current as noted above and at the same time space widely enough to provide sufficient transmission of light to the active region of the cells.

The compromises required in the design geometry of the present grid collectors generally result in an optimized maximum light transmission of approximately 80 to 90%, generally centering around 85%. This in itself results in lower efficiencies than would otherwise be desirable. But these requirements are contradictory. Accordingly, the use of optimum spacing and geometry of the collector grid wire for the best cell performance is an object of this invention.

A further object of this invention is to provide improved collector grids for CdS/Cu$_x$S solar cells which provides a more easily manufactured grid.

Another object of this invention is to provide an improved lower cost grid for CdS/Cu$_x$S solar cells which provides a more easily manufactured grid.

Still another object of this invention is to provide an improved collector grid for CdS/Cu$_x$S solar cells which provides an improved cell output efficiency.

BRIEF DESCRIPTION OF THE PREFERRED EMBODIMENT

This invention finds use with a thin film photovoltaic cell having a body with a pair of thin films forming a photovaltaic barrier junction. One of the films is made of a cadmium sulfide compound. The other is made from a copper sulfide compound. Each of the films has its own electrode which is in ohmic contact therewith. According to the invention, the electrode for the other film comprises a plurality of electrically conductive collector strips disposed in parallel relationship thereon. At least one electrically conductive connector strip is disposed on the other film transverse to the parallel strips and ohmically connected to each of the collector strips. The collector strips are spaced at less than thirty lines per inch and dimensioned to permit at least 90% of the incident light to pass through to the body of the cell.

In a preferred embodiment of the invention, the parallel strips have a width that is not greater than 0.003 inches. This facilitates the use of commercial grade copper sheets which typically are ±0.7 mils in thickness. Additionally, it is desirable that the parallel strips be equally spaced at more than two lines per inch. In a particularly preferred embodiment of the invention the parallel strips are spaced at about seven lines per inch. Cells of this type are easier to manufacture, permitting the use of commercial grade copper which results in a lower cost grid, and furthermore result in an improved cell conversion efficiency. By using less grid wires per inch, the grid design is such that there is an actual increase in light transmission to approximately 95% or more and a significant reduction in shadow effects—less of the barrier layer is covered by the opaque grid wires. The surprising result of this invention is that the net efficiency improvement resulting from the separate effects of the increased light transmission and reduced shadow effect is significantly greater than the increased efficiency due to be expected from the total increased light transmission alone and is directly contrary to the teachings of the prior art. Stated differently, there is a significantly greater increase in short circuit current than would be expected from the increase in intensity of light reaching the active region of the cell alone.

Another surprising point is that while silicone solar cells having grid light transmissions in excess of 90% have been known since 1959, no one heretofore has appreciated, suggested or described that cadmium sulfide cells could use grid light transmissions in excess of 90%. The report entitled "Review and Evaluation of Past Solar Cell Development Efforts" by the Radio Corporation of America, Astro-Electronics Div., Princeton, New Jersey, Final Report, Contract No. NASW-1427 prepared for NASA (1968) gives a historical development of silicon solar cells up to the year 1968. This report clearly shows that grid lines fine enough for greater than 90% light transmission were in use in silicon cells as early as 1959. For example, in FIG. 36 (page 132) of said report, a typical grid structure is shown for use in silicon cells. In said figure, S is the distance between the lines, T is the line thickness while W is the line length. The transmission of the grid structure is defined as the ratio of the open area to the total area, covered and uncovered, and may be calculated from the following formula:

$$\text{Transmission} = \frac{\text{open area}}{\text{total area}} = \frac{N(S \times W)}{N[(S+T) \times W]} = \frac{S}{S+T} \times 100\% \quad (1)$$

where N is the number of unit field patterns as indicated in the figure.

If one calculates then for an optimum grid structure in which T has a value as small as possible and S is calculated for optimum efficiency considering resistive as well as transmission losses, then the calculation becomes:

$$\text{Transmission} = \frac{S}{S+T} = \frac{.319 \text{ cm} \times 100\%}{(.319 \text{ cm}) + (.0125 \text{ cm})} = \frac{.319 \text{ cm} \times 100\%}{.3315 \text{ cm}} = 96.4\% \quad (2)$$

If the silicon cell should be solderless, then the transmission calculation is as follows:

$$\text{Transmission} = \frac{.239}{.239 + .0125} = \frac{.239}{.2415} = 98.8\% \quad (3)$$

Thus, even if one allows for slightly more coverage of the cell due to inabilities in technology, the silicon cells were using grid structures with greater than 90% open area back in 1959. Actually, the art has taught that one should go in a direction opposite to that in which this invention was made. The Clevite Corporation from ten to eleven years after the use of high grid transmission with silicon cells reported in their article "Development of Improved CdS Solar Cells" NAS-3-13467, Final Report 1970 that for cadmium sulfide solar cells, grid spacings between 50-80 lines/per inch were optimum. Thus, the advantages of this invention are indeed surprising and unobvious.

BRIEF DESCRIPTION OF THE DRAWINGS

The novel features that are considered characteristic of this invention are set forth with particularity in the appended claims. The invention, itself, however, both as to its organization and methods, as well as additional objects and advantages thereof, will best be understood from the following description when read in connection with the accompanying drawings, in which:

DETAILED DESCRIPTION OF THE PREFERRED EMBODIMENT

Figure 1:
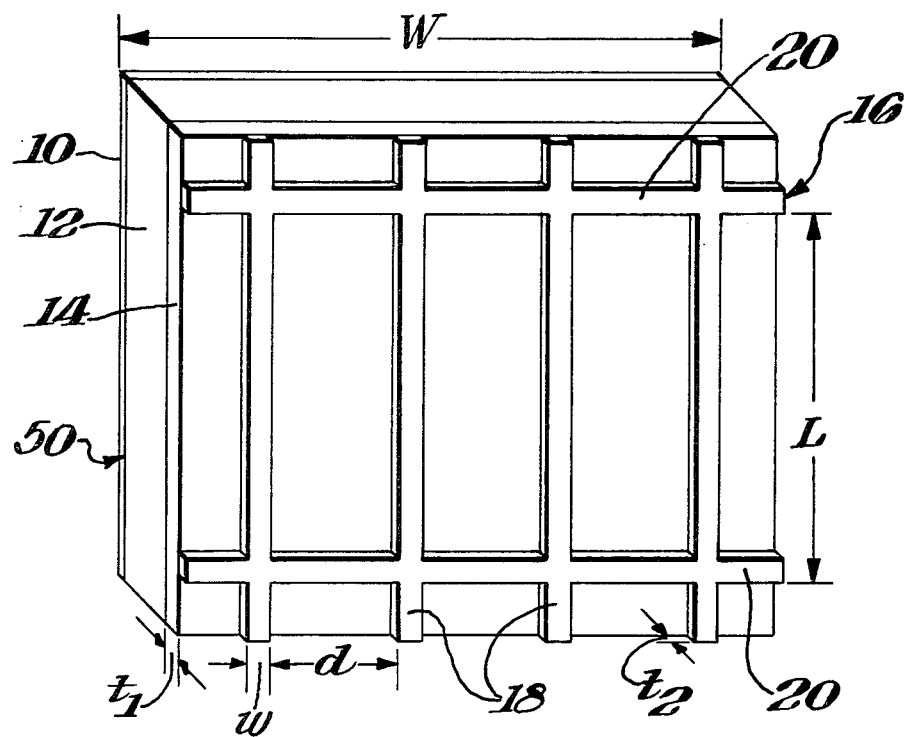
FIG. 1 is a pictorial representation of a solar cell constructed in accordance with this invention and showing one arrangement of a connector.

An otherwise conventional photovoltaic barrier level cell 50 is constructed using cadmium sulfide and copper sulfide for the films. This cell, depicted in the drawings, includes an electrically conductive substrate 10 which typically may be a copper electrode having a zinc coating. This substrate is followed by a layer of cadmium sulfide 12, a barrier layer 14 of copper sulfide, and according to this invention, a copper grid 16 (which may be gold coated) is cemented to the copper sulfide barrier layer 14 with a gold filled cement (not shown). The entire sandwich making up the cell may be covered by a suitable protective coating (not shown) of a plastic such as "MYLAR", this being a trademark of E.I. du Pont de Nemours & Co., Inc. for its films made of poly(ethyleneterephthalate).

This cell may be manufactured using any of the well-known techniques and may be constructed of a cadmium compound. Symbolically, this is represented by the formula CdS. The cadmium sulfide layer is comprised of a plurality of individual crystallites. The barrier or diffusion layer 14 is copper sulfide. Symbolically, this may be represented by the formula $Cu_xS$, where x may vary from one to two, preferably being closer to two after suitable heat treatment as is known. It is desirable that the heat treatment convert most, if not all, of the different copper sulfides making up the deposited copper sulfide layer to chalcocite ($Cu_2S$).

According to this invention the copper grid 16 is formed to have a geometry to provide an optimized light transmission of 95% or more. To achieve this the grid 16 is constructed to have parallel collector electrodes or wires 18 which are spaced between two and thirty lines per inch. With this wide spacing the grid line width may be increased several factors over that previously employed, preferably to as much as 0.003 inch. With these wider grid lines than has historically been employed, commercial thickness copper sheets may be employed thereby further reducing grid costs. The copper grid wires or matrix may be formed by known processes using photoetching to remove the undesired portions of a copper sheet prior to its application to the barrier layer 14. Along the upper and lower portions of the cell (in the drawings) cross connector wires or lines 20 are formed to interconnect ohmically with each of the collecting grid lines 18. Preferably these cross connectors 20 are generally perpendicular to the collector grid lines 18, however, this precise configuration is not required, it only being necessary that the cross connectors 20 be transverse to the collector grid lines 18 so as to electrically interconnect them. The function of the cross connectors 20 is to collect the currents from each of the grid lines 18 and to provide mechanical rigidity to the structure. Use of the cross connectors in excess of five lines per inch tend to reduce light transmission unnecessarily, hence greater spacings are preferred.

As mentioned above, cross connector wires 20 can be along the upper and lower portions of the cell and FIG.

Figure 2:
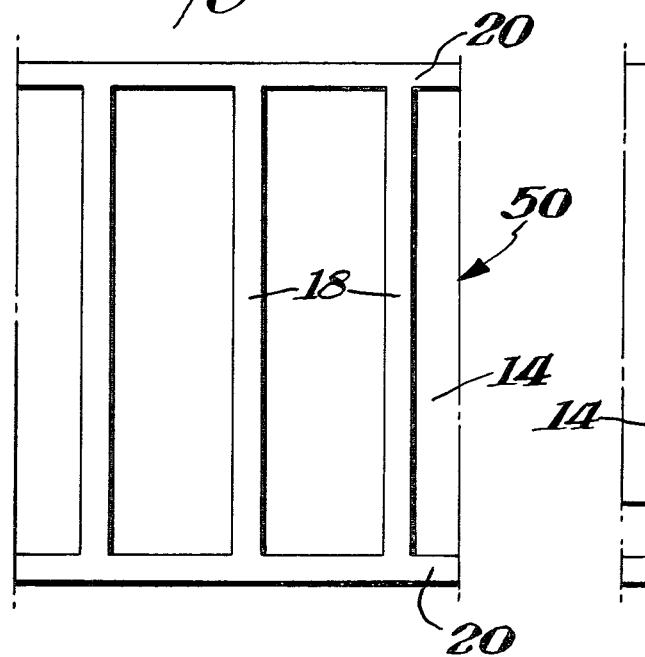
FIG. 2 is a plan view of a solar cell of FIG. 1 in which the connector arrangement is different than that in FIG. 1 but with the cross-connector still situated on the cell or as part of the cell unit.
Figure 3:
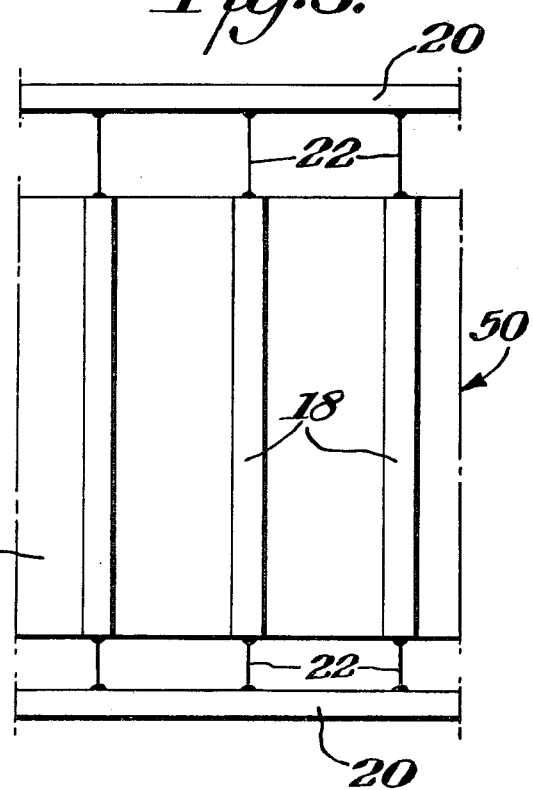
FIG. 3 is another embodiment in which the connector wires are positioned separately apart from the cell through the use of small wires running between the connector and the cell.

1 shows one such arrangement. In that arrangement the connector wires are located on the cell 50 being, in effect, cross-connected with each of the grid lines 18. While this arrangement is very effective, the construction in this cross-like manner is more costly than other possible arrangements which involve the same positioning of the cross connector wires along the upper or lower portions of the cell. For example, in FIG. 2 the cross connector wire is located at one of the very ends of the connector grid wire lines 18 so that it is in a T-like connection with the grid lines 18. In this arrangement the cross connector wire is still right on the face of the cell and the bottom of the cross connector wire is in direct contact with the copper sulfide as is the case with the grid line 18. However, the connectors may be entirely off the cell as shown in FIG. 3, it being necessary only that connector wires 20 be ohmically connected with the grid lines. For such purposes the respective small conductive wires 22 can lead from the connector wire 20 to the respective grid lines 18. Both the arrangements shown in FIGS. 2 and 3 involve simpler, less expensive structures than that depicted in FIG. 1 and of the various arrangements, that shown in FIG. 2 is preferred. Only one cross connector need be used.

While the range of collector grid spacings has been described as lying between two and thirty, it has been found that the resulting cell efficiency tends to optimize in the range of about seven to eight lines per inch with seven representing a most desired value.

The significant advantages derived from this invention is that an easier to manufacture, lower cost grid structure may be used and the cell output efficiency is significantly improved. This efficiency is improved by providing a grid design with an actual increased light transmission of approximately 95% or more and secondly by reducing the shadow effects on the barrier layer by the usage of less grid wires. The net efficiency resulting from the separate effects of increased light transmission and reduced shadow effects most surprisingly has been found to be significantly greater than the increased efficiency due to the expected improvement from increased light transmission alone. It is, thus economically possible using this invention to fabricate grids with actual light transmission approaching that of the theoretical maximum. Surprisingly, there is a greater increase in short circuit current than would be normally expected from the increase in intensity of light reaching the active region of the cell caused by increasing the line spacing. Increasing the line spacing up to an order of magnitude over that known in the prior art has shown little detrimental effect in the collection efficiency of the grid.

Although the reasons for this surprising result are not entirely understood, the following description of the mechanisms involved are offered by way of explanation. An idea of the effects of varying the line widths and spacings can be obtained by considering the total series resistance of the cell. In general, the total series resistance of the cell can be broken into two categories, namely, (1) a resistance of the $Cu_xS$ sheet where there is a non-uniform current flow, and (2) any other resistances present, which can be lumped together into an equivalent value. The series resistive component due to $Cu_xS$ resistance is changed by changing the grid wire spacing geometry, and the contribution to the lumped resistance due to the resistive losses in the grid wires changes with the line widths and grid thicknesses. These two resistive components are thus influenced by the grid design, and a poor design can cause significant increases in the total series resistance resulting in lower cell efficiencies. On the other hand, a grid design where these contributions are very insignificant compared to the other contributions to the series resistance is not economically feasible.

In order to see if the series resistance components influenced by the grid design are dominating the cell resistance, a simple calculation of these two contributions can be performed. Using the simple finger geometry shown in the FIG. 1, and calculating the series resistance due to the $Cu_xS$ layer in the manner described by M. Wolf in Proc. of IRE (48) 1246 (1960), one obtains for a unit cell:

$$\frac{R_{Cu_xS}}{\text{unit cell}} = \frac{p_1(d-w)}{8t_1 L} \quad (4)$$

where the non-uniform current flow has been averaged out by using a uniform current flowing through a distance $(d-w)/4$. Since n unit cells are connected in parallel, the total contribution to the series resistance is:

$$R_{Cu_xS} = \frac{p_1(d-w)}{8t_1 L n} = \frac{p_1(d-w)d}{8t_1 L W} \quad (5)$$

Neglecting the contact resistance between the $Cu_xS$ layer and the grid wires, the series resistance component due to one grid wire is:

$$R_G/\text{wire} = p_2 L / 2 w t_2 \quad (6)$$

and the total grid wire resistance becomes:

$$R_G = \frac{p_2 L}{2 w t_2} \cdot \frac{1}{n} = \frac{p_2 L d}{2 w t_2 W} \quad (7)$$

Using the value of $p_1 \sim 10^{-3}$ ohm-cm determined by Lindquist, using a four-point probe method on $Cu_xS$ ($\mu p$ assumed $\sim 10$ cm$^2$/V sec), a $Cu_xS$ thickness $t$, of $0.1\mu$ and the dimensions of the Clevite grid, the calculated value for the sheet resistance component of a $3\times 3''$ cell is $R_{Cu_xS} \approx 4 \times 10^{-4} \Omega$. The value of $R_G$ (using $p_2 = 1.7 \times 10^{-6}$ $\Omega$cm) is $R_G \approx 2.3 \times 10^{-2}$ $\Omega$. Since these values are below the observed value for total series resistance of 0.15 $\Omega$ in $3\times 3''$ typical cells, increasing the grid spacing, (thus increasing $R_{Cu_xS}$ and $R_G$) should provide increased transmission, possibly without adversely affecting the total series resistance and thus resulting in increased output. This theoretical consideration has been proven out in a series of experiments.

Small cells were fabricated in which grids of wider spacing were used. These modified grids were all laminated to the same $CdS/Cu_2S$ substrate for test comparison in uniformity. The results are summarized in the following table in which d is the spacing between the lines; w is the width of the line; A is the area of the cell; $J_{sc}$ is the short circuit current density—that is, the short circuit current divided by the area; Rs(m$\Omega$) is total series resistance as measured in milliohms; $R_{Cu_xS}$ is the resistance due to the $Cu_xS$ layer in milliohms as calculated using the above equations; and $R_G$(m$\Omega$) is the grid resistance in milliohms as calculated from said equations.

TABLE I

| d + w (mm)* | A (cm$^2$) | Jsc (ma/cm$^2$) | Rs (mΩ) | R$_{Cu_xS}$ (mΩ) | R$_G$ (mΩ) | |
| --- | --- | --- | --- | --- | --- | --- |
| 0.42(60) | 2.44 | 6.55 | 3110 | 0.09 | 23.7 | |
| 1.20(20) | 2.44 | 7.29 | 3110 | 0.75 | 67.9 | |
| 2.54(10) | 2.44 | 8.07 | 3110 | 3.30 | 143.0 | |
| 5.00(5) | 2.44 | 8.19 | 3110 | 12.80 | 283.0 | |
| 0.42(60) | 7.5 | 6.13 | 1120 | 0.0588 | 25.6 | Substrate 1 |
| 0.84(30) | 7.5 | 7.54 | 1130 | 0.235 | 53.1 | |
| 1.20(20) | 7.5 | 7.53 | 1130 | 0.480 | 75.9 | |
| 2.54(10) | 7.5 | 8.00 | 1130 | 2.15 | 160.0 | |
| 5.00(5) | 8.73 | 8.93 | 2720 | 8.30 | 317.0 | |
| 0.42(60) | 54.5 | 13.24 | 150 | .40 | 23.0 | Substrate 2 |
| 2.54(10) | 54.5 | 13.77 | 260 | 1.45 | 143.0 | |

*The numbers in parentheses are the respective number of lines/inch.

$$R_{Cu_xS} = \frac{p_1(d-w)}{4t_1 A}$$

where: $p_1 = 10^3$ Ω cm  $\quad p_2 = 1.7 \times 10^{-6}$ Ω cm
$t_1 = 10^{-5}$ cm  $\quad t_2 = 1.2 \times 10^{-3}$ cm
$$R_G = \frac{p_2 Ld}{wt_2 W}$$
$w = 2.5 \times 10^{-3}$ cm From this it may be observed that by decreasing the number of lines per inch or increasing the line spacing, significantly increased cell efficiencies and short current circuits were achieved.

There has thus been described an improved grid for CdS/CuS cells, which permits the use of a lower cost grid material and results in significantly enhanced cell output efficiency.

It is obvious that many modifications may be made of this inventive concept, and that many modifications may be made in the embodiments hereinbefore described. Therefore, it is to be understood that all descriptive material herein is to be interpreted merely as illustrative, exemplary and not in a limited sense. It is intended that various modifications which might readily suggest themselves to those skilled in the art be covered by the following claims, as far as the prior art permits.

What is claimed is:

1. In a thin film photovoltaic cell with a body having a pair of thin films forming a photovoltaic barrier junction, one of said films being made of cadmium sulfide and the other of said films being made of copper sulfide, each of said films having its own electrode in ohmic contact therewith, the electrode for said other film comprising:

a plurality of electrically conductive collector strips;
means ohmically interconnected to said collector strips; and
said collector strips being parallely spaced between two and thirty lines per inch, equally apart, and dimensioned to permit at least 90% of incident light to pass to said thin films,
said ohmically interconnected means comprising connector strips that are parallel to each other and are equally spaced at about ten lines per inch on said other film and transversely to said collector strips.

* * * * *